Figure 1:
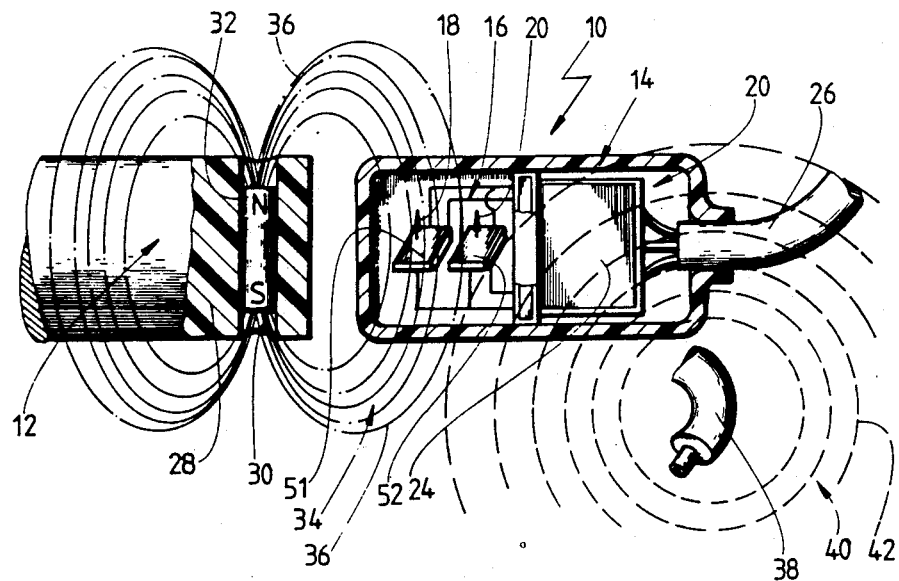

United States Patent [19]

Kammerer et al.

[11] Patent Number: 4,893,027

[45] Date of Patent: Jan. 9, 1990

[54] PROXIMITY SWITCH INSENSITIVE TO INTERFERENCE FIELDS

[75] Inventors: Heinz Kammerer, Ostfildern; Reinhard Stumpe, Neuhausen; both of Fed. Rep. of Germany

[73] Assignee: Gebhard Balluff Fabrik Feinmechanischer Erzeugnisse GmbH & Co., Neuhausen, Fed. Rep. of Germany

[21] Appl. No.: 219,065

[22] PCT Filed: Sep. 21, 1987

[86] PCT No.: PCT/DE87/00426

§ 371 Date: May 20, 1988

§ 102(e) Date: May 20, 1988

[87] PCT Pub. No.: WO88/02579

PCT Pub. Date: Apr. 7, 1988

[30] Foreign Application Priority Data

Sep. 25, 1986 [DE] Fed. Rep. of Germany ....... 3632624

[51] Int. Cl.⁴ ............................................. H03K 17/95
[52] U.S. Cl. .................................... 307/116; 361/179; 340/551; 340/572
[58] Field of Search ....................... 307/112, 115, 116; 361/179, 180; 340/661, 686, 674, 551, 572, 573; 338/32 H, 164; 335/207, 205, 206; 331/65

[56] References Cited

U.S. PATENT DOCUMENTS

| | | |
|---|---|---|
| 2,104,424 | 1/1938 | Bremer et al. |
| 3,103,655 | 9/1963 | Jones ................................ 340/551 |
| 3,122,729 | 2/1964 | Bothwell et al. ............. 340/661 X |
| 3,228,524 | 5/1985 | Magori et al. |
| 3,438,120 | 4/1986 | Sommer . |
| 3,609,527 | 9/1971 | Ellis ...................................... 324/40 |
| 3,697,972 | 10/1972 | Brown .......................... 340/551 X |
| 3,750,128 | 7/1973 | Sapir ............................... 331/65 X |
| 3,764,860 | 10/1973 | Scheda ......................... 340/551 X |
| 3,863,244 | 1/1975 | Lichtblau ............................ 340/572 |
| 3,961,322 | 6/1976 | Lichtblau ...................... 340/572 X |
| 4,001,613 | 1/1977 | Hills et al. ............................ 307/308 |
| 4,015,236 | 3/1977 | Boudeville ..................... 340/551 X |
| 4,063,230 | 12/1977 | Purinton et al. .............. 340/551 X |
| 4,326,197 | 4/1982 | Evin ................................. 307/116 X |
| 4,349,814 | 9/1982 | Akehurst ....................... 307/116 X |
| 4,553,040 | 11/1985 | Truper et al. ..................... 307/116 |
| 4,644,286 | 2/1987 | Torre ................................. 340/572 X |
| 4,673,827 | 6/1987 | Sommer ............................ 307/116 |
| 4,719,362 | 1/1988 | Nest et al. ........................ 307/116 |
| 4,771,359 | 9/1988 | Link ................................... 361/179 |

Primary Examiner—William M. Shoop, Jr.
Assistant Examiner—Paul Ip
Attorney, Agent, or Firm—Kramer, Brufsky & Cifelli

[57] ABSTRACT

In order to improve a proximity switch insensitive to interference fields for detecting the position of a machine element with at least one sensor which generates in the proximity of a machine element standing in a position to be detected a total signal having a detection field signal component caused by the machine element and an interference field signal component caused by the interference field and transmits it to a circuit which converts the total signal into an output signal, such that both the gradients of the detection field generated by the machine element and the gradients of the interference field do not affect response of the proximity switch, it is suggested that the conversion of the total signal into the output signal be carried out by the time dependence of the interference field being determined, by a corresponding sequence of scanning pulses being obtained therefrom and the first signal being scanned with these, and by a value which is determined thereby resulting in an output signal indicating that the machine element is in its position to be detected if this value exceeds a preselectable minimum value with which a minimum field strength required for response of the proximity switch is preselectable.

49 Claims, 7 Drawing Sheets

PROXIMITY SWITCH INSENSITIVE TO INTERFERENCE FIELDS

The invention relates to a proximity switch insensitive to interference fields for detecting the position of a machine element with at least one sensor which generates in the proximity of a machine element standing in a position to be detected a first signal having as a total signal a detection field signal component caused by the machine element and an interference field signal component caused by the interference field and transmits it to a circuit which converts the total first signal into an output signal.

In a large number of proximity switch applications, there is the problem of occurrence of interference fields in the region of a location provided for the proximity switch which result in faulty operation of all proximity switches operating on the basis of detection of an electric or magnetic field. These interference fields are time-dependent. Sources of such interference fields are, for example, power lines connected to welding tongs of welding equipment which owing to the high currents result in magnetic interference fields with considerable field strengths. However, a great number of other occurrences of electric, magnetic or electromagnetic interference fields in the region of a proximity switch are conceivable.

A proximity switch with immunity to interference fields comprising two sensors which are arranged in spaced relation to each other and generate field-dependent signals is known from DE-A 3 438 120. The output signal of this proximity switch is generated by formation of a difference between the two field-dependent signals and comparison of the differential signal with a threshold.

These known proximity switches always produce satisfactory results when the interference fields at the locations of the two sensors are approximately equally large or at least differ by a value which is less than a difference required for the threshold to be exceeded between the field strength of a magnetic field caused by the machine element in its position to be detected at the locations of the first and second sensors. In other words, to ensure satisfactory functioning of this proximity switch, the machine element in its position to be detected had to generate at the location of the first sensor a larger field than at the location of the second sensor, and this difference always had to be greater than the difference between the interference field at the location of the second sensor and the interference field at the location of the first sensor.

This dependency of the magnetic field required for correct detection by the proximity switch on the interference field creates problems in many applications, above all, when the value of these interference fields becomes very large and their gradient in the region of the sensors is large.

The object underlying the invention is, therefore, to improve a proximity switch of the generic kind such that both the gradients of the detection field generated by the machine element of the gradients of the interference field do not affect response of the proximity switch.

This object is accomplished, in accordance with the invention, in a proximity switch of the kind described at the beginning by the conversion of the first signal into the output signal being carried out by the time dependence of the interference field being determined, by a corresponding sequence of scanning pulses being obtained therefrom and the first signal being scanned with these, and by a value which is determined thereby only resulting in an output signal indicating that the machine element is in its position to be detected if this value exceeds a preselectable minimum value with which a minimum field strength required for response of the proximity switch is preselectable.

This solution enables the minimum magnetic field required for response of the invention proximity switch to be selected independently of the strength or also the gradient of the interference field since, in contrast with the solutions known so far, the interference field does not result from formation of a difference between interference field strengths measured at different locations but rather from the time dependence of the interference field being determined and used to eliminate the interference field only on the basis of its time dependence. Hence the amplitude of the interference field as such is not of primary importance in its elimination. Consequently, the size of the absolute values of the interference field are also irrelevant.

In the inventive solution described above, it was not specified how the inventive circuit detects an interference field signal and determines the time dependence of the interference field from it.

There are several possible ways of doing this. A first possibility is to use the interference field signal component of the first signal in order to determine the time dependence of the interference field. Accordingly, only one sensor is required herein to generate the total signal including the interference field signal component. This enables direct determining of the time dependence of the interference field and generation of the sequence of scanning pulses with which the first signal, in its entirety, with its interference field signal component and its detection field signal component is then, in turn, scanned.

In order to achieve this, it is not absolutely necessary for the first signal to be separated. It is also possible to scan the time dependence of the first signal, for example, with a pulse sequence and to determine therefrom the time dependence of the interference field. However, the simplest way is for the interference field signal component to be coupled out of the first signal and transmitted as second signal to a circuit for determining the time dependence of the interference field which generates therefrom so-called second pulses as scanning pulses with which the first signal designated first signal is scanned.

Aside from the first possibility described above for determining the time dependence of the interference field from the first signal, there is a second advantageous possibility. Herein, a second sensor is provided which is arranged at a larger distance from the machine element standing in a position to be detected than the first sensor and generates a second signal including the interference field signal component. To determine the time dependence of the interference field, the sequence of first pulses or of second pulses, respectively, corresponding to the time dependence of the interference field is obtained as scanning pulses either from the first signal generated by the first sensor or from the second signal generated by the second sensor, and the second or first signal, respectively, is scanned with these scanning pulses. As in the prior art, the second possibility includes two sensors which both generate a first and second signal, respectively, including the interference field signal component and one of which is used to generate the sequence of scanning pulses with which the respective other signal is then scanned. By applying this principle, the gradient of the interference field between the two locations of the sensors is also irrelevant in a proximity switch with two sensors.

There are several possible ways of obtaining the sequence of scanning pulses corresponding to the time dependence of the interference field. It is particularly simple if in the embodiments described above, the scanning pulses, i.e., either the first pulses or the second pulses are generated at each point in time at which the first signal or the second signal, respectively, crosses a reference value.

In all of the possibilities of the inventive solution described above, the signal to be scanned can be determined in many different ways. For example, it is possible to determine the signal to be scanned by forming the integral of the amplitude values of this signal during a pulse and the integral then corresponds to the value to be determined. Such scanning can be carried out in a simple way, particularly if the pulses of the pulse sequence lie in the region of zero crossings of the interference field since in the case in which only the time-dependent interference field is present at both sensors, the integration of the amplitude values of the signal to be scanned results in zero, and positive signals are only obtained when some constant components are present. However, it is much more advantageous if, at each point in time at which the first signal generated at the first sensor crosses a first reference value, a first pulse is generated, and if at each point in time at which the second signal generated at the second sensor crosses a second reference value, a second pulse is generated, and if a time interval between the first and the second pulses corresponds to the value to be determined, with the preselectable minimum value representing a preselectable minimum time. In this embodiment of the inventive proximity switch, not only the interference field components are eliminated on the basis of their time dependence, but, in addition, a constant field component at the first sensor, caused by the machine element in its position to be detected, is converted into a time displacement of the first pulse which is proportional to this field component. Therefore, only a time difference between the first pulses and the second pulse need be measured. This can be carried out in a simple way with known pulse processing methods and, consequently, all of the further signal processing can be performed with digital pulse processing methods. It is emphasized that the field strengths of the time-dependent interference field component, therefore, have no influence whatever on the time interval of the pulses. Hence even displacements of the first pulse corresponding to small constant field components at the first sensor are detectable independently of the field strength of the interference field and, consequently, also a threshold of the proximity switch corresponding to a minimum time interval of the pulses is selectable independently of the field strengths of the interference field and, therefore, can also lie very low.

There are many possible ways of measuring the time interval between the first pulse and the second pulse. With known digital processing methods, the time interval can be determined in a simple way by provision of at least one element ascertaining pulse coincidences, in order to determine the time interval, since pulse coincidences can be ascertained in a simple way with NAND or NOR gates.

Measurement of pulse coincidences is always simple if the pulses have a non-zero width. Therefore, it is advantageous for the first pulse to be widened with respect to time. It may also be advantageous for the second pulse to be alternatively or additionally widened with respect to time.

The pulses can be widened by a large number of possible measures. For example, it is conceivable for widening of the pulses to be effected by special pulse shaping elements.

In the present case, however, generation of the pulses is based on time-variable signals and so the simplest possibility of widening the pulses is for this to be carried out with threshold values lying on either side of the respective reference value, with a pulse being generated when the respective signal lies between these threshold values. Such a measure avoids relatively elaborate pulse shaping elements.

In effecting pulse widening, it may prove particularly advantageous to obtain symmetrical pulses so that the threshold values lie symmetrically in relation to the respective reference value.

In the embodiments described so far, it was not specified how the respective reference values are to lie and hence also not at which point of the time-dependent first and second signals generation of a first or second pulse is to occur. In order for the pulses to be changed as little as possible in their width upon a change in the amplitude of the respective signal, it is advantageous for the first pulse to be generated in the region of a zero crossing of the first signal. The same applies to generation of the second pulse. It is, therefore, similarly advantageous for the second pulse to be generated in the region of a zero crossing of the second signal.

One skilled in the art has several ways of determining the time interval between the first and second pulses by means of the element ascertaining pulse coincidences. It is, for example, conceivable to trigger with the second pulse a so-called measurement pulse whose coincidence with the first pulse could be ascertained in a simple manner. To avoid having to generate this measurement pulse, too, and to measure the time interval between the first and second pulses directly without an intermediate pulse, it is suggested that the time interval be determined by ascertaining a coincidence of the widened first or second pulse with the second or first pulse, respectively. In other words, one of the pulses is widened so that a coincidence between the first and the second pulses is determined until the time displacement is so great that the pulse which has been widened with respect to time no longer coincides with the other pulse. This is a simple way of setting a preselectable minimum time by widening one of the pulses, the minimum time always being exceeded when there is no longer coincidence between the widened pulse and the other pulse. Accordingly, the minimum time corresponds to approximately the half pulse width of the widened pulse, in which case, the other pulse must then have a negligible time-related width.

It is also possible to work with two widened pulses. The time interval is then determined by ascertaining a coincidence of the widened first with the widened second pulse.

Within the scope of the above embodiment, it has proven particularly expedient for the first pulse to be wider than the second pulse by approximately a factor four.

There are also several possibilities of determining the coincidence of the first and second pulses using logic circuits. It is particularly advantageous for a statically clocked D-flip-flop with the following truth table

| D | T | Q |
|---|---|---|
| 0 | 0 | 1 |
| 1 | 0 | 0 |
| 0 | 1 | D value existing prior to transition of T = 0 to T = 1 inverted |
| 1 | 1 | |

D } inputs of
T } D-flip-flop
Q    inverted output of D-flip-flop to be used as element for ascertaining pulse coincidence for an inventive proximity switch.

This flip-flop has the advantageous characteristic of holding the previous value in the case of transition from T=0 to T=1 and so once the first and second pulses no longer overlap fully, an output signal differing from zero is present at least over certain periods of time.

Such a partly changing signal is unsuitable as output signal for a proximity switch since it must always show the same output signal when the machine element is standing in its position to be detected. The same applies to the case where the machine element is not standing in its position to be detected. For this reason, provision is made for a holding element to follow an output of the element ascertaining pulse coincidences. This holding element ensures that the proximity switch always delivers a constant output signal.

Since in the case of partial overlapping of the first and second pulses, the output signal of the statically clocked D-flip-flop may drop over a period of time corresponding to approximately a half period of the interference field, provision is made for the holding element to hold an output signal of the element ascertaining pulse coincidences during at least a half period of the interference field so that there is a constant output signal in each case.

In the simplest embodiment of a holding element, the holding element is an RC element.

In special cases, a gradient of the interference field over the spacing between the two sensors which is too large, may result in the inventive proximity switch delivering an output signal indicating that the machine element is in its position to be detected although the machine element is not standing in its position to be detected. This is the case when the width of the second pulse is of the same size as that of the first pulse or exceeds it. These cases can be avoided by the first sensor being arranged at a minimum distance corresponding to the equation $$r = \frac{d}{k-1}$$

r = minimum distance of first sensor from a source of the interference field
d = sensor spacing
k = ratio of width of first to width of second pulse from a source of the interference field. This ensures that the gradient of the interference field is only so large that the case described above does not occur. The above equation clearly demonstrates that the field strength of the interference field does not affect the functioning of the inventive proximity switch.

The sensors commonly used for measurement of fields are designed so as to have a preferred direction of sensitivity as far as field measurement is concerned. In the embodiments described so far, this preferred direction of sensitivity was not specified and hence could have any orientation in the case of both sensors. In order to manufacture universally usable sensors with a directional dependency which is not too great or is only jointly defined for a field to be measured, it is advantageous for the sensors to have a preferred direction of sensitivity and to be arranged such that the preferred directions of sensitivity stand parallel to one another.

In the embodiments explained so far, it was not specified whether the sensors are to be suited for detection of electric, magnetic or electromagnetic fields. It is conceivable to design an inventive proximity switch which is suitable for each one of the above applications. However, as a rule, the known proximity switches operate according to the principle that either the machine element itself generates a magnetic field or the machine element deforms a magnetic field. For this reason, it is advantageous for the sensors to be magnetic field sensors.

Above all, in all cases where it is not possible to arrange a magnet in the machine element itself, but the machine element consists of a material which is suited to deform a magnetic field, it is necessary to associate with the first sensor a permanent magnet whose magnetic field causes flux through the first sensor in its preferred direction of sensitivity. In such an embodiment of the inventive proximity switch, the deformation of the magnetic field of the permanent magnet results in the flux through the first sensor and hence also its constant signal component caused by the permanent magnet always undergoing change when the machine element is standing in its position to be detected.

It is particularly advantageous for the arrangement to be such that the permanent magnet is placed with a north or a south pole facing the first sensor since, in these cases, the flux through the sensor has a high flux density.

In all these applications of a permanent magnet in the region of the first sensor, it must, however, be taken into consideration in the fixing of the first reference value that the first signal also exhibits a constant component on account of the constant flux through the first sensor when the machine element is not standing in its position to be detected. In this case, detection of the machine element in its position to be detected is only possible in a simple manner if the first reference value corresponds to a first signal in the absence of the interference field and in the absence of the machine element from its position to be detected.

Particularly advantageous arrangement of the permanent magnet relative to the sensors and to the machine element is obtained by the sensors being placed such that their preferred directions of sensitivity point in the direction of a line between the sensors and the permanent magnet is arranged on a side of the first sensor that faces away from the machine element in its position to be detected. In this case, the presence of the machine element in its position to be detected results in the flux through the first sensor being more intensive than in the absence of the machine element from its position to be detected. In a further preferred arrangement, the sensors are placed such that their preferred directions of sensitivity stand approximately perpendicularly to a line between the sensors, and, as explained above, in such a case, the permanent magnet should lie on one side of the first sensor. In these cases, the presence of the machine element in its position to be detected results in distortion of the magnetic field in such a way that the magnetic flux through the sensors decreases in relation to the case in which the machine element is not standing in its position to be detected.

For detection of magnetic fields, it is particularly expedient for the first and second sensors to be Hall sensors as these are protected against magnetic overload and hence cannot be damaged even in the case of very high interference fields of up to 600 kA/m.

It is, however, also possible for the sensors to be magneto-resistive sensors, in which case, in particular, Permalloy sensors are suitable.

However, all of the above-mentioned sensors, when used in all of the embodiments of the inventive proximity switch, are not put to use in the full field range that is possible, but, as a rule, only in a range covering approximately 10% of the usable field strength range of these sensors. For this reason, temperature drifts, in particular, of the zero value line, i.e., of the offset, of the sensors have a very strong effect in that the pulses are subjected to time fluctuations and, therefore, the minimum time preselected as threshold can be exceeded merely on account of these temperature drifts. An advantageous possibility of suppressing such temperature drifts, i.e., of making their percentage component lower, consists in arranging on an active surface of at least one of the sensors, a material with a susceptibility of $\mu > 1$. This material has the characteristic of concentrating the magnetic field lines and hence causing an increased magnetic flux through the sensors in their preferred direction of sensitivity. Therefore, the sensors serving to detect the magnetic fields are used in a larger field strength range. Consequently, the first and/or second signals also increase and the drift of the zero line thus results in a reduced time displacement of the first and/or second pulses. This is due to the fact that the first or second signal intersects the reference or threshold values with a larger gradient and the same zero point fluctuation, therefore, results in a smaller time fluctuation of the pulses.

Figure 2:
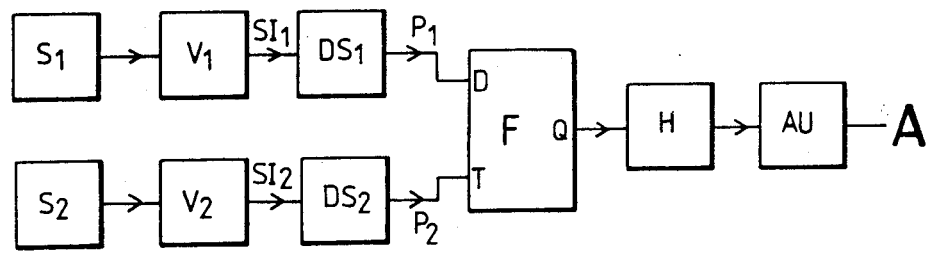
Figure 3:
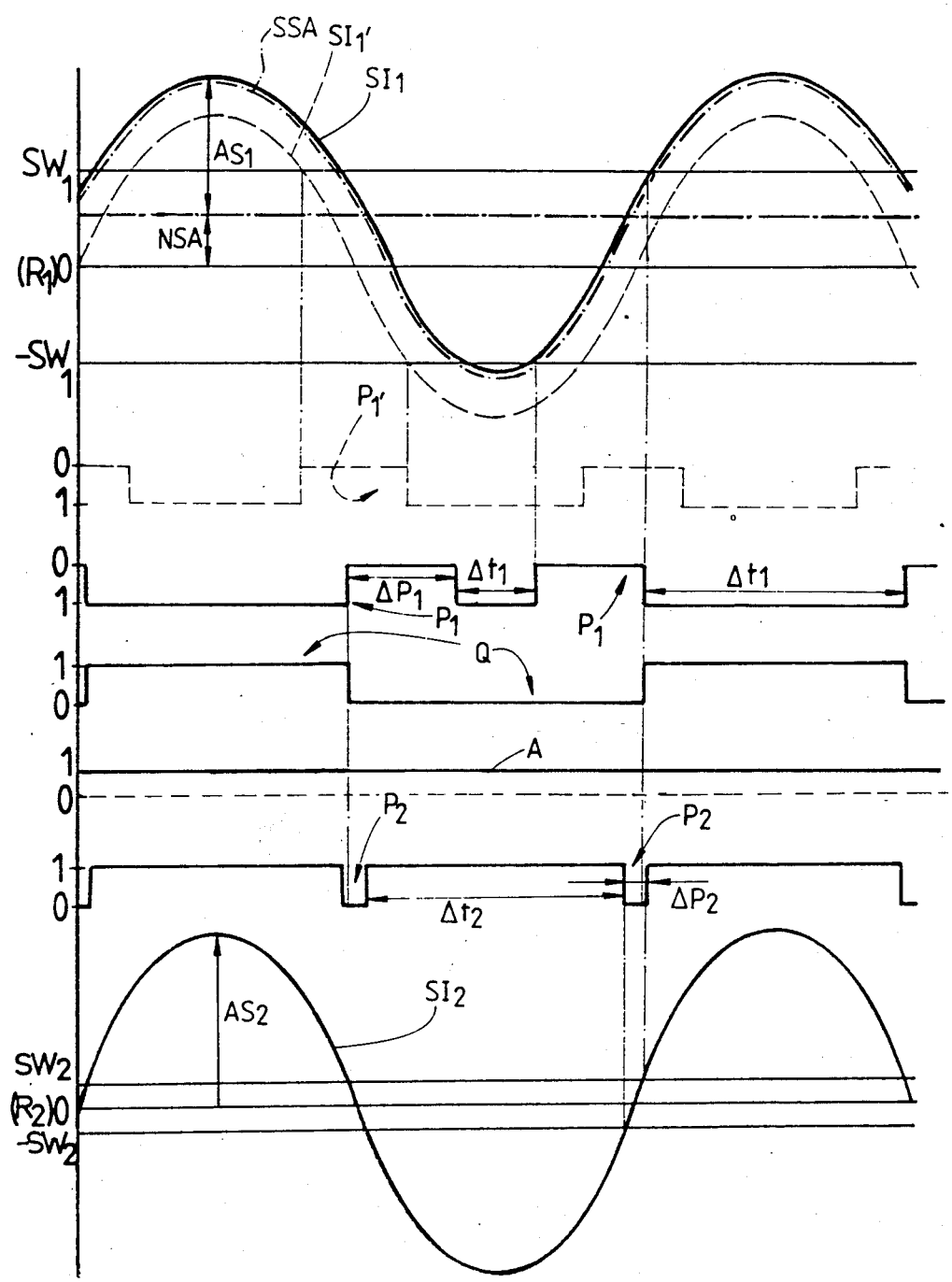
Figure 4:
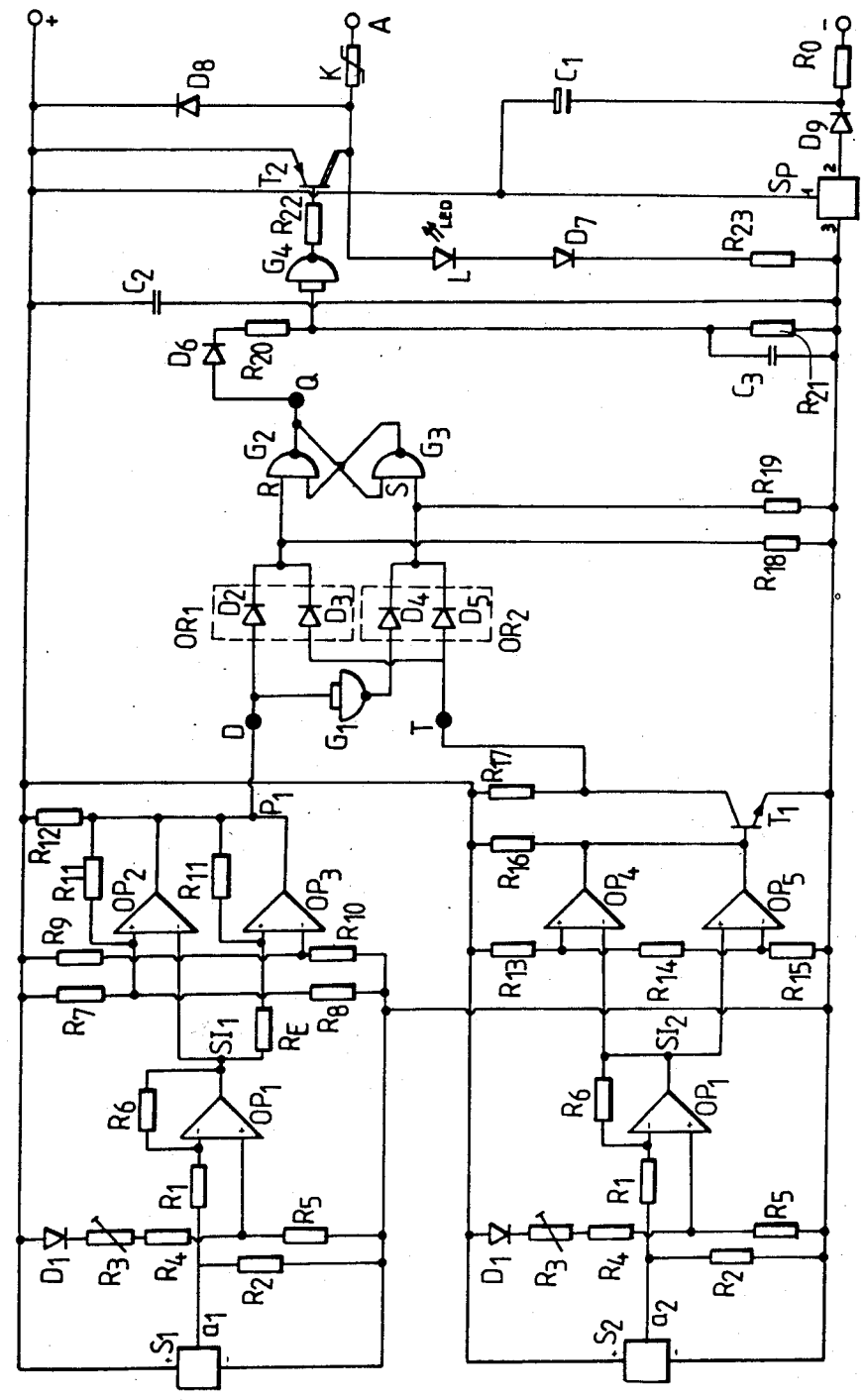
Figure 5:
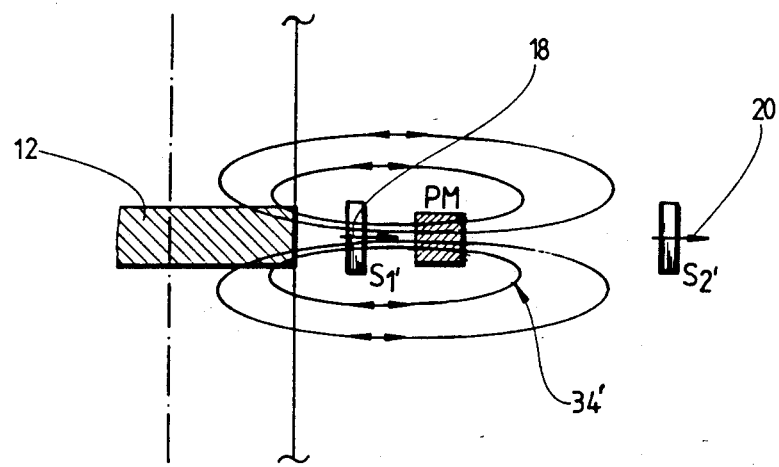
Figure 6:
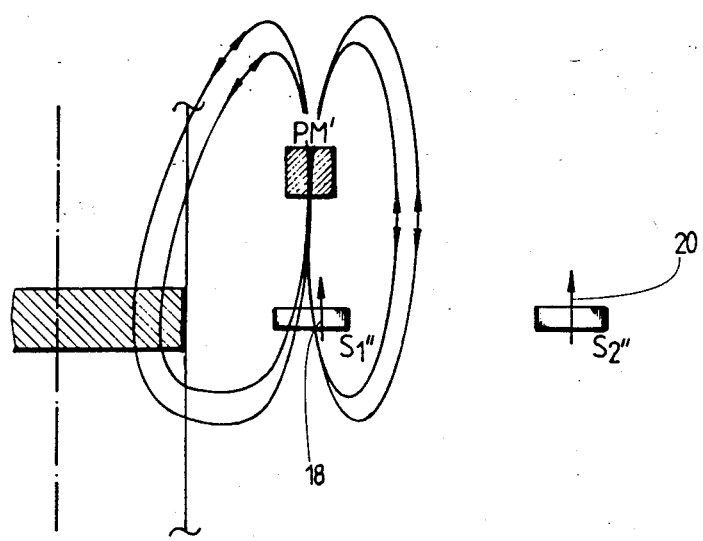
Figure 7:
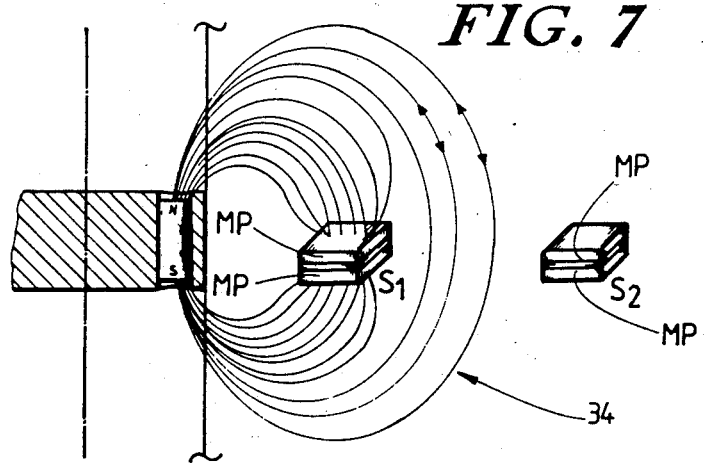
Figure 8:
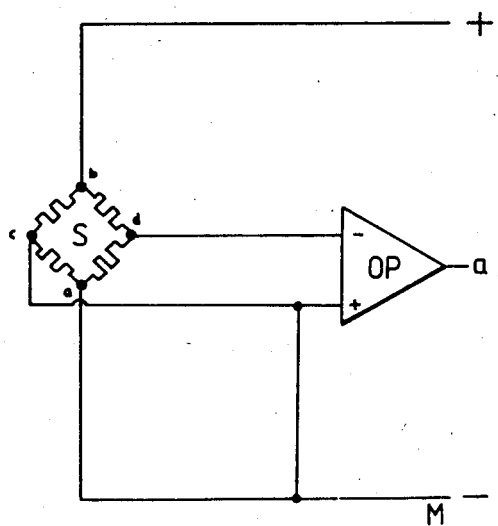
Figure 9:
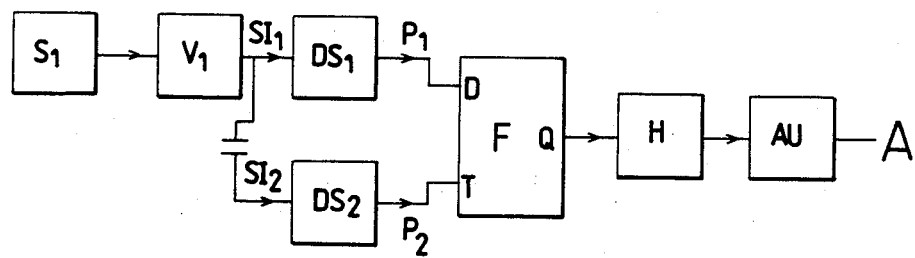

Further features, advantages and characteristics of the inventive proximity switch are apparent from the following description and the appended drawings of some embodiments. The drawings show:

FIG. 1 a perspective, partly broken-open illustration of a first embodiment of an inventive proximity switch;

FIG. 2 a block diagram representing the mode of operation of the first embodiment;

FIG. 3 a schematic illustration of time dependence of signals occurring in FIG. 2;

FIG. 4 a circuit diagram of the first embodiment;

FIG. 5 a second embodiment of the inventive proximity switch;

FIG. 6 a third embodiment of the inventive proximity switch;

FIG. 7 a fourth embodiment of the invention proximity switch;

FIG. 8 an embodiment of a sensor comprised of magneto-resistive sensors;

FIG. 9 a fifth embodiment of the inventive proximity switch; and

Figure 10:
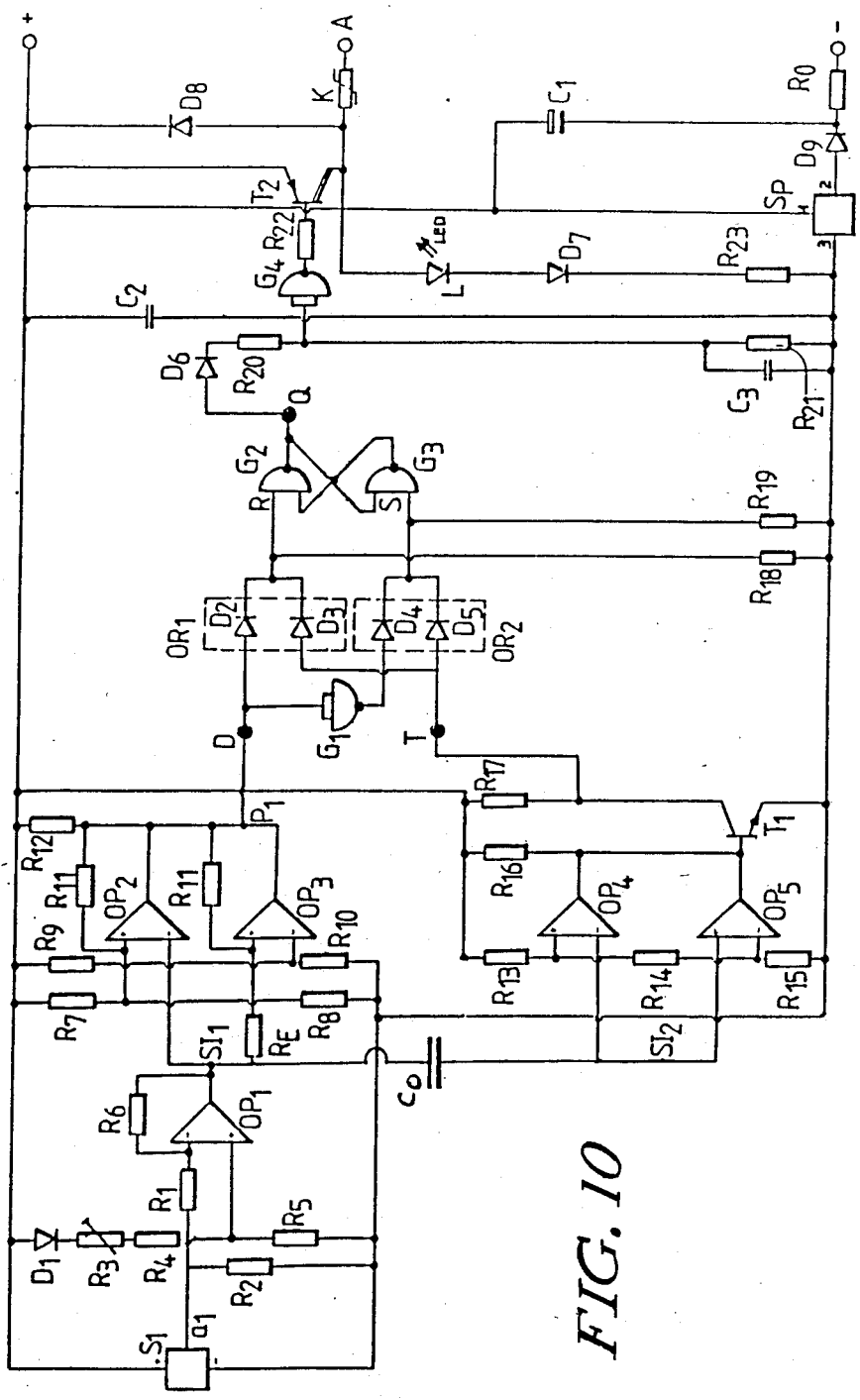

FIG. 10 a circuit diagram of the fifth embodiment.

A first embodiment of the inventive proximity switch, designated in its entirety 10 in FIG. 1, for detection of a machine element 12 in its respective position to be detected comprises a housing 14 in which two sensors S1 and S2 are arranged in spaced relation to each other in a housing section 16 facing the machine element 12 such that sensor S1 is located nearer the machine element 12 in its position to be detected than sensor S2. The two sensors S1 and S2 each have preferred directions of sensitivity 18 and 20, indicated by arrows, and are preferably arranged such that the preferred directions of sensitivity 18 and 20 lie parallel to each other. Arranged in a housing section 22 facing away from the machine element 12 is a circuit designated in its entirety 24 by means of which an output signal A of the proximity switch is generated. The inventive proximity switch 10 is supplied with power through a supply cable 26 which opens into housing section 22 and also includes a line for transmission of output signal A.

In a region 28 facing the proximity switch, the machine element 12 has a bore 30 extending through this region 28 and accommodating a magnet 32. The magnetic field 34 emanating from a north and a south pole of bar magnet 32 penetrates with its field lines 36 at least housing section 16 of proximity switch 10 and hence also the two sensors S1 and S2.

The preferred directions of sensitivity 18 and 20 lying parallel to each other are preferably oriented so as to extend parallel to the field lines 36 of magnetic field 34 penetrating sensors S1 and S2.

In the vicinity of proximity switch 10, a power line 38 or a welding electrode conducting a high current, for example, for welding operations and devices with a similarly high current requirement generates an interference field 40 whose interference field lines 42 extend substantially radially around power line 38 and likewise penetrate the entire proximity switch 10 and hence also sensors S1 and S2—in the most unfavorable case, parallel to the preferred directions of sensitivity 18, 20.

Hence both field lines 36 of magnetic field 34 and interference field lines 42 of interference field 40 penetrate sensors S1 and S2. However, in accordance with the invention, the spacing between sensors S1 and S2 is selected such that the magnetic field 34 which decreases very strongly with increasing distance from magnet 32 contributes only insignificantly in the region of sensor S2 and, therefore, as a rule, can be neglected in the case of sensor S2. On the other hand, the interference field is usually so strong on account of the high currents in power line 38 that it penetrates both sensors S1 and S2, the field strength at the location of sensors S1 and S2 depending on how power line 38 is arranged relative to sensors S1 and S2.

In the arrangement shown in FIG. 1, the field strength of interference field 40 is greater at the location of sensor S2 than at the location of sensor S1.

A general difference between interference field 40 and magnetic field 34 is to be seen in the fact the units operated by way of power line 38 are usually supplied with a.c., and so the interference field 40 is time-dependent according to the frequency of the a.c., whereas the magnetic field 34 is always a constant field which is invariable with respect to time.

The circuit 24 operates in accordance with the block circuit diagram of FIG. 2 whose functions are additionally explained in the illustration in FIG. 3 of the signals and pulse sequences generated.

Sensor S1 penetrated by magnetic field 34 and interference field 40 generates a signal SI1 amplified by amplifier V1.

As shown in FIG. 3, it is comprised of an oscillating interference field signal component SSA originating from interference field 40 with an amplitude AS1 and of a constant detection field signal component NSA originating from magnetic field 34 and hence represents in total an oscillating signal displaced with respect to a zero line. Signal SI1 is fed to a discrimator DS1 which determines whether an amplitude of the time dependent signal SI1 lies between two thresholds SW1 and −SW1 lying symmetrically in relation to a reference value R and, in the present case, also to the zero line, or not. If the amplitude of signal SI1 is greater than thresholds SW1 and −SW1, discriminator DS1 emits a signal logical 0 (ZERO) at its output. If the amplitude of signal SI1 is smaller than thresholds SW1 and −SW1, i.e., lies between these two, the discriminator emits a signal logical 1 (ONE) at its output. Hence each zero crossing of the amplitude of signal SI1 results in a rise to logical 1 of the signal logical 0 which is otherwise present at the output of discriminator DS1 and due to the rise to logical 1 in a signal designated pulse P1, with a time-related width ΔP1 of pulse P1 depending on how thresholds SW1 and −SW1 lie relative to the zero line. If thresholds SW1 and −SW1 lie far away from the zero line, i.e., if they are very high, the time-related width ΔP1 of pulse P1 is also very large, whereas if the thresholds SW1 and −SW1 lie low and close to the zero line, the time-related width ΔP1 of pulse P1 is small.

If signal SI1 is displaced by the amount of detection field signal component NSA in the positive direction with respect to the zero line, the zero crossings of the amplitude of signal SI1 do also not occur in equal time intervals, but rather two pulses P1 follow in a short time interval ΔT1, while the subsequent pulse P1 follows after a longer time interval ΔT1'. Of course, signal SI1 may also be displaced by the amount of component NSA in the negative direction.

In the description of the present embodiment, it is assumed that sensor S2 is penetrated by interference field 40 only. Hence the interference field 40 generates in sensor S2 a signal SI2 amplified by an amplifier V2. As explained above, on account of the a.c. flowing in power line 38, signal SI2 has the same time dependence as signal SI1, but shows only an amplitude component AS2 of the a.c. field and hence extends symmetrically in relation to a zero line. This signal SI2 is fed to a discriminator DS2 functioning in the same way as discriminator DS1 and having two thresholds SW2 and −SW2 lying symmetrically in relation to a reference value R2 and, in the present case, also to the zero line. Depending on whether the amplitude AS2 of signal SI2 lies between thresholds SW2 and −SW2 or not, an output signal 1 of discriminator DS2 is reduced to 0 or not. Hence each zero crossing of amplitude AS2 in discriminator DS2 results in a pulse P2 changing from the value 1 to the value 0 with a time-related width ΔP2 which likewise depends on the location of the thresholds SW2 and −SW2 lying symmetrically in relation to the zero line, i.e., if thresholds SW2 and −SW2 lie low, the time-related width ΔP2 of pulses P2 also decreases, whereas it increases if thresholds SW2 and −SW2 lie further apart.

Since signal SI2 lies symmetrically in relation to the zero line, the time intervals ΔT2 between successive pulses P2 are also equally large, but they always change when signal SI2 also has a constant component. Within the meaning of the present invention, pulses P2 serve as scanning pulses P with which the first signal SI1 is scanned. In the described embodiment, this scanning of the first signal SI1 is carried out by a pulse processing method, i.e., by comparison of signal SI1, likewise converted in the described manner into pulses P1, with pulses P2.

For this comparison of pulses P2 and P1, pulse P1 is fed to an input D of a statically clocked D-flip-flop F and pulse P2 to the input T of this flip-flop. A statically clocked D-flip-flop has the characteristic of storing a logical variable D as a function of input T and so an inverted output Q of the statically clocked D-flip-flop is controlled in accordance with the following truth table

| | D-Flip-Flop | |
|---|---|---|
| D | T | Q |
| 0 | 0 | 1 |
| 1 | 0 | 0 |
| 0 | 1 | ⎫ D value existing prior |
| 1 | 1 | ⎬ to change of T = 0 to |
| | | ⎭ T = 1 |

This truth table shows that output Q of the statically clocked D-flip-flop F shows the inverted values of input D when T=0, and that in the case of T=1 those values are always present at output Q which existed at input D prior to transition from T=0 to T=1.

As is best shown in FIG. 3, output Q always becomes temporarily 0 during a period of the interference field when pulses P1 and P2 partly overlap one another. However, if, for example, the stationary component NSA of signal SI1 is so large that the time interval ΔT1 of successive pulses P1 is so small that these lie between two pulses P2 in the time interval ΔT2, then output signal Q is always 1. Furthermore, signal Q is always 0 when pulses P1 and P2 overlap fully, i.e., pulses P2 lie with their pulse width ΔP2 within pulses P1 with their pulse width ΔP1, which is always the case when the stationary component BS of signal SI1 is 0, i.e., when sensor S1 is not penetrated by a static magnetic field.

As is apparent from the latter, it is advantageous for the width ΔP1 of pulse P1 to always be selected larger than the width ΔP2 of pulse P2 since, in such a case, it is always guaranteed that the proximity switch will not indicate that the machine element 12 is in its position to be detected on account of some slight fluctuations in a static magnetic field and, consequently, reliable holding of the indication "no machine element in its position to be detected" is ensured.

In the present embodiment, the width ΔP1 was selected such that it is approximately four times larger than the width ΔP2. Transferred to the threshold values SW1 and SW2 in first approximation, this results in the threshold values SW1 lying approximately four times higher than the threshold values SW2. However, this is applicable only to the case in which the amplitudes of the interference field 40 at the location of both sensors S1 and S2 are approximately equally large. If the amplitude of the interference field increases, this results in a relative narrowing of the time-related width of pulses ΔP1 or ΔP2.

As explained above, the output signal Q of the statically clocked D-flip-flop F always changes between 0 and 1 when pulses P1 and P2 partly overlap. In this state, however, a displacement of pulses P1 relative to pulses P2 has already occurred on account of the constant component BS in signal SI1. Hence this state already indicates to the proximity switch an approach of the machine element 12 to its position to be detected. Consequently, also output signal A of the proximity switch should not be subjected to time fluctuations but rather show a constant signal indicating the machine element 12 is in its position to be detected. For this reason, the statically clocked D-flip-flop F is followed by a pulse holding element H which holds the state 1 at output Q of flip-flop F at least during a half period of the time-dependent interference field and hence a signal differing from 0 is always available at its output of an output stage AS following this pulse holding element. Therefore, the output stage AS, in turn, delivers the necessary output signal A indicating that the machine element 12 is in its position to be detected.

Differently from the above case, in which it was assumed that sensor S1 is penetrated by both magnetic field 34 and interference field 40, in the case in which the machine element 12 is not standing in its position to be detected, sensor S1 is penetrated by interference field 40 only. Hence a signal SI1' having only the oscillating amplitude component AS1 is fed to discriminator DS1. In this case, signal SI1' is symmetrical in relation to the zero line. Consequently, also the zero crossings and hence also pulses P1' always occur after the same time intervals. A pulse center of pulse P1' corresponding to the respective zero crossing of amplitude AS1, therefore, occurs at the same time as a pulse center of pulse P2 corresponding to the zero crossing of amplitude AS2. Hence pulses P1' and P2 overlap fully. As explained above, pulse width ΔP1' is usually selected approximately four times larger than pulse width ΔP2 and so D-flip-flop F always indicates the value 0 at its output Q.

The inventive proximity switch functions as follows:

Proceeding from the state last described above, in which output Q of flip-flop F always indicates 0, the value 0 is also present at output A of the proximity switch. This corresponds to the state in which the machine element 12 is not standing in its position to be detected. Approach of the machine element 12 to the proximity switch 10 results in sensor S1 being penetrated to an increasing degree by magnetic field 34. Hence the BS component of signal SI1 constantly increases and, consequently, signal SI1 becomes asymmetrical in relation to the zero line. Therefore, the zero crossings of the amplitude of signal SI1 also become displaced and, consequently, also pulses P1 in comparison with pulse P1', which correspond to a sensor S1 penetrated solely by interference field 40. The displacement of pulses P1 relative to pulses P1', which increases as component BS increases, and hence also relative to pulses P2 does first not result in a change in the output signal as long as pulses P2 still overlap fully with pulses P1. However, at that moment at which a side flank of pulses P1 going from 0 to 1 falls within one of pulses P2, this results at the output of D-flip-flop F in its output Q assuming the state 0 if pulse P1 has increased before an end of a pulse P2, i.e., has changed to the value 1, since in the case of a change at input T from 0 to 1, the previous value, i.e., 1 at input D is held at output Q as 0. The signal at output Q corresponds to the signal Q illustrated in FIG. 3.

In this case, as mentioned above, the pulse holding element H comes into effect. This ensures that the signal Q dropping to 0 in individual intervals does not occur in this form at the output, but rather than the value 1 of signal Q is held at least during one half period of the interference field oscillating with respect to time and, therefore, a signal differing from 0 and indicating that the proximity switch 12 is in its position to be detected is always present at output A of an output stage AU.

The circuit in FIG. 3 corresponding to the block diagram in FIG. 2 shows in detail a positive voltage supply (+) and a negative voltage supply (−). In order to make a voltage available which is as constant as possible, a voltage stabilizer SP is provided. This is connected at input 1 to the voltage supply (+) and at input 2 via a diode D9 and a resistor RO to the negative voltage supply. It keeps a controlled negative voltage available for the circuit at output 3. A capacitor C1 is provided between input 1 of voltage stabilizer SP and a tap between diode D9 and resistor RO for smoothing and noise suppression of the voltage to be stabilized. The stabilized voltage made available at output 3 of voltage stabilizer SP is additionally smoothed by a capacitor C2. Hence a positive supply voltage (+) and a negative supply (−) are available to the inventive circuit.

Sensor S1 is connected to both the positive supply voltage (+) and the negative supply voltage (−) and is supplied with these. In accordance with the magnetic field penetrating sensor S1, an output a1 of sensor S1 lies at a potential which is alterable by the magnetic field. The output a1 of sensor S1 is connected via a resistor R1 to an inverted input of an operational amplifier OP1. A resistor R2 is also arranged between a1 and R1 and the negative supply voltage. A non-inverting input of operational amplifier OP1 lies at a potential determined by a voltage divider comprising, on the one hand, a diode D1 connected to the positive supply voltage (+) with a temperature drift corresponding to the selected sensor S1, following this a controllable resistor R3 for setting an offset, and in addition to this, a series-connected, constant resistor R4 and, on the other hand, a resistor R5 connected to the negative supply voltage (−). An output of the operational amplifier OP1 is connected for negative feedback via a resistor R6 to the inverting input of operational amplifier OP1. Owing to this amplifier circuit, the signal a1 of sensor S1 occurs as amplified signal SI1 at the output of operational amplifier OP1.

Sensor S2 is likewise supplied with the positive supply voltage (+) and the negative supply voltage (−). Hence a signal a2 corresponding to the magnetic field penetrating sensor S2 is likewise present at output a2 of sensor S2. This signal a2 is amplified by an amplifier circuit to produce a signal SI2. The amplifier circuit is identical with the amplifier circuit described above and its components have the same reference numerals.

As indicated in the block diagram of FIG. 2, signal SI1 is fed to a discriminator DS1 comprising two operational amplifiers OP2 and OP3. A non-inverting input of operational amplifier OP2 is fixed at a potential by a voltage divider lying between the positive and the negative supply voltages (+) and (−) and comprising two resistors R7 and R8. Similarly, an inverting input of operational amplifier OP3 is fixed at a defined potential by a voltage divider lying between the positive and the negative supply voltage (+) and (−) and comprising two resistors R9 and R10.

In this case, the potential at the non-inverting input of operational amplifier OP2 and the potential at the inverting input of operational amplifier OP3 represent the two threshold values SW1 and −SW1 of the discriminator. The signal SI1 is fed to an inverting input of operational amplifier OP2 and to a non-inverting input of operational amplifier OP3. A resistor RE is arranged before the non-inverting input of the operational amplifier. Switching hystereses are set by means of resistors RE and R11 and resistors R7 and R11 at operational amplifiers OP3 and OP2, respectively.

An output of operational amplifier OP2 is additionally connected to the non-inverting input via a feedback line comprising a resistor R11. The same applies to an output of operational amplifier OP3. Both outputs of operational amplifiers OP2 and OP3 are interconnected and are connected via a resistor R12 to the positive supply voltage. Hence a pulse P1 occurs at the two interconnected outputs of operational amplifiers OP2 and OP3 which represent an output of discriminator DS1.

Discriminator DS2 is comprised in a similar way to discriminator DS1 of two operational amplifiers OP4 and OP5. A non-inverting input of operational amplifier OP4 and an inverting input of operational amplifier OP5 are similarly fixed with respect to their potential. In the case of discriminator DS2, this is effected by a voltage divider comprising three resistors R13, R14 and R15 arranged between the positive supply voltage and the negative supply voltage.

The potential for the non-inverting input of operational amplifier OP4 is fixed by resistors R13, on the one hand, and R14 and R15, on the other hand, whereas the potential of the inverting input of operational amplifier OP5 is fixed, on the one hand, by the two resistors R13 and R14 and, on the other hand, by resistor R15.

In exactly the same way as with discriminator DS1, signal SI2 is fed to both an inverting input of operational amplifier OP4 and a non-inverting input of operational amplifier OP5. Outputs of operational amplifiers OP4 and OP5 are interconnected and fixed with respect to the positive supply voltage (+) via a resistor R16. A signal occurring at the two interconnected outputs of operational amplifiers OP4 and OP5 is fed to a base of a transistor T1 which lies with collector and emitter between the positive supply voltage (+) and the negative supply voltage (−). Transistor T1 inverts the signal at the interconnected outputs of operational amplifiers OP4 and OP5. A further resistor R17 is arranged between the collector of transistor T1 and the positive supply voltage. Pulse P2 is tapped at the output of discriminator DS2 between resistor R17 and the collector of transistor T1.

As explained in the block diagram of FIG. 2, pulses P1 and P2 are fed to input D and T, respectively, of a statically clocked D-flip-flop F. As shown in FIG. 4, its configuration is as follows:

The basic unit is comprised of two NAND gates G2 and G3. An input of a gate is connected to an output of the other gate, in each case. The two free inputs of gates G1 and G2 are designated in the usual manner by the letters R and S. An OR element OR1 indicated by a dashed frame is arranged before input R. It is comprised of two diodes D2 and D3 arranged in parallel, with their outputs connected to input R. An input of diode D2 is connected to the input D of the statically clocked D-flip-flop F and an input of diode D3 to the input T of the statically clocked D-flip-flop. In the same way, an OR element OR2, likewise indicated by a dashed frame, is arranged before input S of the flip-flop. It is similarly comprised of two diodes D4 and D5 which are connected in parallel, with their outputs connected to input S of the flip-flop. A NAND gate G1 operating as inverter is also arranged before an input of diode D4, and its output is connected to the input of diode D4. An input of the gate G1 operating as inverter is connected to the input D of the statically clocked D-flip-flop.

An input of diode D5 lies directly at input T of the statically clocked D-flip-flop. The output of gate G2 represents the inverting output Q of the statically clocked D-flop-flop F. In addition, resistors R18 and R19, respectively, are arranged between inputs R and S, respectively, of the flip-flop and the negative supply voltage.

This statically clocked D-flip-flop F with its output signal Q is followed by the pulse holding element H shown in FIG. 2. It comprises a diode D6 following output Q, a resistor R20 connected in series with diode D6, and a time element following resistor R20 and comprising a resistor R21 and a capacitor C3 connected in parallel with it. The time element is connected on one side to the negative supply voltage (−). Once a 1 occurs at output Q of the statically clocked D-flip-flop F, diode D6 becomes conductive and hence charges capacitor C3, whereas diode D6 blocks when a 0 occurs at output Q and so capacitor C3 can only discharge slowly via resistor R21. Between resistor R20 and the time element comprising resistor R21 and capacitor C3, a signal Q smoothed by the time element is tapped and fed to an input of a NAND gate G4 operating as inverter and controlling with its output via a resistor R22 the base of an output transistor T2. Output transistor T2 is connected at its emitter to the positive supply voltage (+). With its collector, it, on the one hand, supplies via a short-circuit protection element K the output signal A and, on the other hand, activates a light-emitting diode L. The light-emitting diode L is connected to the negative supply voltage by a further diode D7 and a resistor R23 connected in series with it. Diode D7 is merely provided as protection against incorrect polarity in order to prevent breakdown of the light-emitting diode L. Once output transistor T2 activates output A, the light-emitting diode L usually arranged on the switch simultaneously lights up. A tap connected to an input of a diode D8 whose output is connected to the positive supply voltage (+) is provided as additional protection against incorrect polarity between short-circuit protection element K and the collector of output transistor T2.

A second embodiment of the inventive proximity switch is schematically illustrated in FIG. 5. The sensors S1' and S2' used in this second embodiment are, in principle, the same as sensors S1 and S2 of the first embodiment. However, in contrast with the first embodiment, the machine element 12 itself does not carry a bar magnet 32. Sensors S1' and S2' are again arranged such that their preferred directions of sensitivity 18' and 20' lie parallel to each other, but are oriented in the direction of the spacing between sensors S1' and S2'.

To generate the necessary magnetic field for detection of the machine element 12, a permanent magnet PM is arranged at a side of sensor S1' remote from the machine element 12 in its position to be detected. Permanent magnet PM has a magnetic field 34' which penetrates sensor S1' in the direction of machine element 12 and returns from there along an ellipsoidal path to a side of the permanent magnet 12 facing away from sensor S1'. Once the machine element 12 is in its position to be detected, as shown in FIG. 5, the magnetic field 34' is attracted in the direction of machine element 12 and deformed in such a way that the flux through sensor S1' in its preferred direction of sensitivity is stronger, whereas the flux through sensor S1' is less when the machine element 12 is removed from its position to be detected.

Therefore, in the second embodiment, too, approach of the machine element 12 to its position to be detected results in sensor S1 detecting an additional component of a constant magnetic field. However, a constant field component is also present in the region of sensor S1 when the machine element 12 is not standing in its position to be detected and so signal S1 always has a constant field component. To guarantee the same functioning as in the first embodiment, it is, therefore, necessary that thresholds SW1 and −SW1 not be arranged symmetrically in relation to the zero line of signal SI1 but rather that the reference value R1 be placed symmetrically in relation to the constant signal component which is also present when the machine element 12 is not standing in its position to be detected.

A third embodiment of the inventive proximity switch is shown in FIG. 6. Herein, the machine element 12 likewise does not possess a bar magnet 32 itself, but rather a permanent magnet PM' is similarly associated with sensor S1''. Sensors S1'' and S2'' are, in principle, arranged in the same way as in the first embodiment, i.e., their two preferred directions of sensitivity 18 and 20 stand parallel to each other and substantially perpendicularly on a line between the two sensors S1'' and S2''. Permanent magnet PM' is arranged at one side of sensor S1'' in such a way that the magnetic field 34'' of permanent magnet PM' causes flux through sensor S1'' which is generally in its preferred direction of sensitivity 18.

Once the machine element 12 is standing in its position to be detected, magnetic field 34'' is deformed in the direction of machine element 12 and hence decreases the flux through sensor S1'' in all. Therefore, when the machine element 12 is in its position to be detected, the constant component BS of signal SI1 is altered. The circuit functions, in principle, exactly as in the first embodiment, but as in the second embodiment, it is ensured that threshold values SW1 and −SW1 do not lie symmetrically in relation to the zero line of signal SI1, but rather symmetrically in relation to the constant component which penetrates sensor S1'' when the machine element 12 is not in its position to be detected.

FIG. 7 shows a fourth embodiment of the inventive proximity switch which corresponds in its entire design and also in its function to the first embodiment. Herein, sensors S1 and S2 are coated on one or both sides with a material MP with a magnetic susceptibility $\mu > 1$. This material causes concentration of the magnetic fields and hence results in stronger magnetic fields penetrating sensors S1 and S2. Such an increase in the intensity of the magnetic fields is necessary because the Hall sensors which are, for example, used are suitable for a field strength range of approximately 0 to over 100 kA/m, but in a design in accordance with the first embodiment are used only in a field strength range of 0 to approximately 7 or 8 kA/m. When the available measurement range is used to only such a slight extent, temperature drifts have a very strong effect. The effect of the temperature drifts can be reduced by the magnetic field penetrating sensors S1 and S2 being intensified by the material MP. This enables greater exploitation of the available field strength range. Hence the percentage effect of the temperature drifts is lower and, therefore, they can almost be suppressed.

The Hall sensors described above are available as a complete component. It is, however, also possible within the scope of the present invention to replace the Hall sensors by Permalloy sensors which each comprises four Permalloy resistors interconnected as Wheatstone bridge. These resistors are generally meander-type layers which are vapor-deposited on a common carrier substrate, for example, a silicon chip. These are commercially available Permalloy sensors which are obtainable, for example, from the firms Valvo, Sony or Siemens. Each of the sensors 5 has four connections a, b, c, d (FIG. 8), with connections a, b and c, d corresponding to opposed tape of the Wheatstone bridge.

As shown in FIG. 8, such a sensor S is connected at its connections a and b to the negative and positive supply voltage, respectively, for the sensors, whereas the opposed center connections c and d of the Wheatstone bridge circuit are connected to an inverting and a non-inverting input of an operational amplifier OP having the output signal a of the sensor available at its output. Hence the Permalloy sensor S can be used together with the operational amplifier OP instead of the above-described Hall sensors in the circuit of FIG. 4.

A fifth embodiment, shown in FIGS. 9 and 10, of the inventive proximity switch shows a simplified version of the configurations described above. This amplified version is distinguished, as shown in FIG. 9, by the fact that the second sensor S2 and the associated amplifier V2 are dispensed with, and that the interference field signal component SSA is coupled out of the first signal SI! containing as a total signal the detection field signal component NSA and the interference field signal component SSA by means of a capacitor and fed as signal SI2 to discriminator DS2 which is identical in design with discriminator DS1 described above.

This is also shown in the circuit diagram of the fifth embodiment in FIG. 10 which is completely identical with that of the first embodiment in FIG. 4 from that point onwards at which signals SI1 and SI2 are present. Also, the circuitry of sensor S1 and amplifier V1 is identical with the circuit diagram in FIG. 4 up to generation of signal SI1. The circuit diagram in FIG. 10 differs from that in FIG. 4 in that sensor S2 and the amplifier V2 associated with it are dispensed with. Instead of this, the output of operational amplifier OP1 at which signal SI1 occurs is connected to the inverting input of operational amplifier OP4 and to the non-inverting input of operational amplifier OP5 via a capacitor CO which couples the interference field signal component SSA out of signal SI1 and, therefore, generates the signal SI2 corresponding to the interference field signal component SSA.

Regarding the function of the simplified fifth embodiment, reference is made to the full details of the first embodiment, in particular, to the explanations of the function in accordance with FIG. 3.

The fifth embodiment of the inventive proximity switch may also be improved in like manner as the first embodiment by the additional measures described in conjunction with the second, third and fourth embodiments.

In a particularly advantageous embodiment, the following components are used in the circuit of FIGS. 4 to 9:

|     | Type             | Manufacturer          |
| --- | ---------------- | --------------------- |
| S1  | 8SSAE1 or UGN 3503U | Honeywell or Sprague |
| S2  | 8SSAE1 or UGN 3503U | Honeywell or Sprague |
| OP1 | LM 358           | Valvo                 |
| OP2 | LM 339           | Valvo                 |
| OP3 | LM 339           | Valvo                 |
| OP4 | LM 339           | Valvo                 |
| OP5 | LM 339           | Valvo                 |
| G1  | 4093             | Valvo                 |
| G2  | 4093             | Valvo                 |
| G3  | 4093             | Valvo                 |
| G4  | 4093             | Valvo                 |
| SP  | 79L05            | Motorola              |
| D1  | BAW56            | Siemens               |
| D2  | BAV70            | Siemens               |
| D3  | BAV70            | Siemens               |
| D4  | BAV70            | Siemens               |
| D5  | BAV70            | Siemens               |
| D6  | ½ BAW101         | Siemens               |
| D7  | ½ BAW101         | Siemens               |
| D8  | ZPY39            | ITT                   |
| L   | CQV35F           | Siemens               |
| K   | Q63100-P2390     | Siemens               |
| T1  | BCX707           | Siemens               |
| T2  | BST61            | Valvo                 |
| C0  | 1 µF             |                       |
| C1  | 220 nF           |                       |
| C2  | 6.8 µF           |                       |
| C3  | 100 nF           |                       |
| R0  | 56 Ω             |                       |
| R1  | 10 kΩ            |                       |
| R2  | 1.8 kΩ           |                       |
| R3  | 3.3 kΩ           |                       |
| R4  | 10 kΩ            |                       |
| R5  | 18 kΩ            |                       |
| R6  | 180 kΩ           |                       |
| R7  | 15 kΩ            |                       |
| R8  | 27 kΩ            |                       |
| R9  | 100 kΩ           |                       |
| R10 | 33 kΩ            |                       |
| R11 | 470 kΩ           |                       |
| R12 | 6.8 kΩ           |                       |
| R13 | 47 kΩ            |                       |
| R14 | 6.8 kΩ           |                       |
| R15 | 33 kΩ            |                       |
| R16 | 100 kΩ           |                       |
| R17 | 6.8 kΩ           |                       |
| R18 | 100 kΩ           |                       |
| R19 | 100 kΩ           |                       |
| R20 | 10 kΩ            |                       |
| R21 | 820 kΩ           |                       |
| R22 | 3.9 kΩ           |                       |
| R23 | 560 Ω            |                       |

We claim:

1. A proximity switch for detecting the position of a machine element comprising:
   at least one sensor providing a first signal having a total signal comprising a detection field signal component caused by a machine element in proximity with said at least one sensor and in interference field signal component caused by an interference field;
   circuit means, responsive to said first signal for providing an output signal as a function of the detection field signal component, said circuit means including:
   means for providing a sequence of scanning pulses in response to a time dependence of said interference field;
   means for scanning said first signal with said scanning pulses; and
   means for providing a threshold signal in response to the scanning pulses indicating that said machine element is in a position to be detected, wherein the value of the threshold signal is preselectable to a minimum value with which a minimum field strength required for response of said proximity switch is established.

2. Proximity switch as defined in claim 1, characterized in that said interference field signal component of said first signal is used to determine the time dependence of said interference field.

3. Proximity switch as defined in claim 2, characterized in that said interference field signal component is coupled out of said first signal and transmitted as a second signal to said circuit means for determining the time dependence of said interference field which generates therefrom second pulses as the scanning pulses with which said first signal is scanned.

4. Proximity switch as defined in claim 1, characterized in that a second sensor is provided at a larger distance from said machine element standing in a position to be detected than said first sensor and generates a second signal including a second interference field signal component, and in that in order to determine the time dependence of said interference field, the sequence of first pulses or of second pulses, respectively, corresponding to the time dependence of said interference field, is obtained as the scanning pulses either from said first signal generated by said first sensor or from said second signal generated by said second sensor, and said second signal or said first signal, respectively, is scanned with these scanning pulses.

5. Proximity switch as defined in claim 3, characterized in that said first pulses or said second pulses, respectively, are generated at each point in time at which said first signal or said second signal, respectively, crosses a first or second reference value or, respectively.

6. Proximity switch as defined in claim 4, characterized in that at each point in time at which said first signal generated at said first sensor crosses a first reference value, a first pulse is generated; in that at each point in time at which said second signal generated at said second sensor crosses a second reference value, a second pulse is generated; and in that a time interval between said first and said second pulse corresponds to the threshold signal value, the preselectable minimum value of the threshold signal representing a preselectable minimum time.

7. Proximity switch as defined in claim 6, characterized in that at least one element ascertaining pulse coincidences, in other words first and second signal crossings of the first and second reference values, respectively, is provided to determine the time interval.

8. Proximity switch as defined in claim 6, characterized in that said first pulses are widened with respect to time.

9. Proximity switch as defined in claim 8, characterized in that said second pulses are widened with respect to time.

10. Proximity switch as defined in claim 1, characterized in that said scanning pulses are widened with respect to time.

11. Proximity switch as defined in claim 8, characterized in that a widening of said first pulse is effected with threshold values lying on either side of the respective reference values, a first, second or scanning pulse being generated when the respective first or second signal lies between these threshold values.

12. Proximity switch defined in claim 11, characterized in that said threshold values lie symmetrically in relation to said respective first and second reference values.

13. Proximity switch as defined in claim 1, characterized in that said first pulses are generated in the region of a zero crossing of said first signal.

14. Proximity switch as defined in claim 4, characterized in that said second pulses are generated in the region of a zero crossing of said second signal.

15. Proximity switch as defined in claim 9, characterized in that the time interval is determined by ascertaining a coincidence of said widened first pulses or second pulses with said second pulses or first pulses, respectively.

16. Proximity switch as defined in claim 9, characterized in that the time interval is determined by ascertaining a coincidence of said widened first with said widened second.

17. Proximity switch as defined in claim 7, characterized in that a statically clocked D-flip-flop with the following truth table

| D | T | Q |
|---|---|---|
| 0 | 0 | 1 |
| 1 | 0 | 0 |
| 0 | 1 | D value existing prior to transition of T = 9 to T = 1 inverted |
| 1 | 1 | |

D } inputs of statically
T } clocked D-flip-flop
Q    inverted output of statically clocked D-flip-flop is used as the at least one element ascertaining pulse coincidences.

18. Proximity switch as defined in claim 7, characterized in that an output of said element ascertaining pulse coincidence is followed by a holding element.

19. Proximity switch as defined in claim 18, characterized in that said holding element holds an output signal of said element ascertaining pulse coincidences over at least a half period of said interference field.

20. Proximity switch as defined in claim 4, characterized in that said first sensor is arranged at a minimum distance from a source of said interference field which corresponds to the equation $$r = \frac{d}{k-1};$$

wherein
r = minimum distance of said first sensor from a source of said interference field;
d = sensor spacing; and
k = ratio of width of first pulse to width of second pulse.

21. Proximity switch as defined in claim 6, characterized in that said first and second sensors have a preferred direction of sensitivity and are arranged such that said preferred directions of sensitivity stand parallel to each other.

22. Proximity switch as defined in claim 21, characterized in that said first and second sensors are magnetic field sensors.

23. Proximity switch as defined in claim 22, characterized in that a permanent magnet whose magnetic field causes flux through said first sensor in its preferred direction of sensitivity is associated with said first sensor.

24. Proximity switch as defined in claim 23, characterized in that said permanent magnet is arranged with a north or a south pole facing said first sensor.

25. Proximity switch as defined in claim 23, characterized in that said first reference value corresponds to a first signal in the absence of said interference field and in the absence of said machine element from its position to be detected.

26. Proximity switch as defined in claim 23, characterized in that said first and second sensors are arranged such that their preferred directions of sensitivity point in the direction of a line between said first and second sensors, and that said permanent magnet is arranged on a side of said first sensor that faces away from said machine element in its position to be detected.

27. Proximity switch as defined in claim 23, characterized in that said first and second sensors are arranged such that their preferred directions of sensitivity stand approximately perpendicularly on a line between said sensors.

28. Proximity switch as defined in claim 1, characterized in that said at least one sensors are Hall sensors.

29. Proximity switch as defined in claim 1, characterized in that said at least one sensors are magnetoresistive sensors.

30. Proximity switch as defined in claim 29, characterized in that said at least one sensors are Permalloy sensors.

31. Proximity switch as defined in claim 1, characterized in that a material with a susceptibility $\mu > 1$ is arranged on an active surface of at least one of said at least one sensors.

32. A proximity switch for detecting the position of a machine element comprising:
at least one sensor providing a first signal having a total signal comprising a detection signal component caused by a machine element in proximity with said at least one sensor and an interference field signal component caused by an interference field;
circuit means responsive to said first signal for providing an output signal as a function of the detection field signal component, said circuit means including:
means for generating an indication signal according to the time-dependent appearance of the interference field,
means for coincident selection comprising a signal input and receiving said first signal at said input, a clock input and receiving said indication signal at said input, and a signal output, at which an output signal appears;
said means for coincident selection being designed for changing said output signal in accordance with said first signal at said signal input as long as no indication signal appears at said clock input and for maintaining said output signal in accordance with said input signal applied before the appearance of said indication signal at said clock input during application of said indication signal.

33. Proximity switch as defined in claim 32, characterized in that said means for generating said indication signal comprise means for coupling said interference field signal component out of said first signal and transforming it into said indication signal for determining the time-dependent appearance of said interference field.

34. Proximity switch as defined in claim 32, characterized in that said means for generating said indication signal comprise a second sensor at a larger distance from said machine element standing in a position to be detected than said first sensor.

35. Proximity switch as defined in claim 32, characterized in that said circuit means includes first threshold means for generating a detection signal if said first signal crosses a first reference value.

36. Proximity switch as defined in claim 32, characterized in that said means for generating said indication signal comprise second threshold means for generating said indication signal if said interference field crosses a reference value.

37. Proximity switch as defined in claim 32, characterized in that said means for generating said indication signal comprise means for generating said indication signal in pulse shape.

38. Proximity switch as defined in claim 37, characterized in that means for widening said pulse-shaped indication signal with respect to time are provided.

39. Proximity switch as defined in claim 32, characterized in that said means for coincident selection is a statically clocked D-flip-flop with the following truth table

| D | T | Q |
|---|---|---|
| 0 | 0 | 1 |
| 1 | 0 | 0 |
| 0 | 1 | D value existing prior to transition of T = 0 to T = 1 inverted |
| 1 | 1 | |

D } inputs of statically
T } clocked D-flip-flop
Q    inverted output of statically -continued

| D | T | Q |
|---|---|---| clocked D-flip-flop

40. Proximity switch as defined in claim 32, characterized by first and second sensors, each having a preferred direction of sensitivity and arranged such that said preferred directions of sensitivity stand parallel to each other.

41. Proximity switch as defined in claim 40, characterized in that said first and second sensors are magnetic field sensors.

42. Proximity switch as defined in claim 41, characterized in that a permanent magnet whose magnetic field causes flux through said first sensor in its preferred direction of sensitivity is associated with said first sensor.

43. Proximity switch as defined in claim 42, characterized in that said permanent magnet is arranged with a north or a south pole facing said first sensor.

44. Proximity switch as defined in claim 42, characterized in that said first and second sensors are arranged such that their preferred directions of sensitivity point in the direction of a line between said first and second sensors, and that said permanent magnet is arranged on a side of said first sensor that faces away from said machine element in its position to be detected.

45. Proximity switch as defined in claim 42, characterized in that said first and second sensors are arranged such that their preferred directions of sensitivity stand approximately perpendicularly on a line between said first and second sensors.

46. Proximity switch as defined in claim 32, characterized in that said at least one sensors are Hall sensors.

47. Proximity switch as defined in claim 32, characterized in that said at least one sensors are magnetoresistive sensors.

48. Proximity switch as defined in claim 47, characterized in that said at least one sensors are Permalloy sensors.

49. Proximity switch as defined in claim 32, characterized in that a material with a susceptibility $\mu > 1$ is arranged on an active surface of at least one of said at least one sensors.

* * * * *

UNITED STATES PATENT AND TRADEMARK OFFICE
CERTIFICATE OF CORRECTION

PATENT NO. : 4,893,027
DATED : January 9, 1990
INVENTOR(S) : Heinz Kammerer and Reinhard Stumpe It is certified that error appears in the above-identified patent and that said Letters Patent is hereby corrected as shown below:

Title page:

Delete as U.S. Patent Documents under References Cited:

2,104,424  1/1938  Bremer et al.
    3,228,524  5/1985  Magori et al.
    3,438,120  4/1986  Sommer Add as Foreign Patent Documents under References Cited:

2,104,424  8/1972  W. Germany
    3,228,524  5/1985  W. Germany
    3,438,120  4/1986  W. Germany Signed and Sealed this Thirtieth Day of October, 1990

Attest:

HARRY F. MANBECK. JR.

*Attesting Officer*    *Commissioner of Patents and Trademarks*